United States Patent
Yin et al.

(10) Patent No.: US 8,898,025 B2
(45) Date of Patent: Nov. 25, 2014

(54) SYSTEM AND METHOD FOR MONITORING POWER FILTERS AND DETECTING POWER FILTER FAILURE IN A WIND TURBINE ELECTRICAL GENERATOR

(75) Inventors: Bo Yin, Singapore (SG); John Godsk Nielsen, Horslet (DK); Kim B. Larsen, Hadsund (DK); Ove Styhm, Hadsten (DK); Kheng Hong Ang, Singapore (SG)

(73) Assignee: Vestas Wind Systems A/S, Aarhus N (DK)

( * ) Notice: Subject to any disclaimer, the term of this patent is extended or adjusted under 35 U.S.C. 154(b) by 0 days.

(21) Appl. No.: 12/860,023

(22) Filed: Aug. 20, 2010

(65) Prior Publication Data

US 2011/0106470 A1 May 5, 2011

Related U.S. Application Data

(60) Provisional application No. 61/235,839, filed on Aug. 21, 2009.

(30) Foreign Application Priority Data

Aug. 21, 2009 (DK) .................................. 2009 70094

(51) Int. Cl.
*G01R 31/00* (2006.01)
*H02M 1/12* (2006.01)
*H02J 3/01* (2006.01)
*G01R 19/06* (2006.01)
*G01R 31/34* (2006.01)
*H02J 3/38* (2006.01)
*G01R 31/02* (2006.01)

(52) U.S. Cl.
CPC ............... *H02M 1/12* (2013.01); *G01R 19/06* (2013.01); *H02J 3/01* (2013.01); *G01R 31/343* (2013.01); *Y02E 40/40* (2013.01); *H02J 3/386* (2013.01); *Y02E 10/763* (2013.01); *G01R 31/028* (2013.01)
USPC ........................................................... 702/58

(58) Field of Classification Search
None
See application file for complete search history.

(56) References Cited

U.S. PATENT DOCUMENTS

| | | | |
|---|---|---|---|
| 3,859,564 A | 1/1975 | Zulaski | |
| 4,011,512 A | 3/1977 | Drury | |
| 6,924,565 B2 * | 8/2005 | Wilkins et al. | 290/44 |
| 8,058,753 B2 * | 11/2011 | Achilles et al. | 307/153 |
| 2004/0230377 A1 * | 11/2004 | Ghosh et al. | 702/3 |
| 2007/0132248 A1 * | 6/2007 | Weng et al. | 290/44 |
| 2009/0299697 A1 * | 12/2009 | Hamby et al. | 702/182 |
| 2010/0060288 A1 * | 3/2010 | Myroth et al. | 324/503 |
| 2010/0148508 A1 * | 6/2010 | Garcia | 290/44 |

FOREIGN PATENT DOCUMENTS

EP 0645866 A1 3/1995

OTHER PUBLICATIONS

ELSPEC, Wind energy; Reactive power compensation systems, 2008, technical note, 1-5.*
Danish Patent and Trademark Office, Search Report issued in related Danish patent application serial No. PA2009 70094 dated Mar. 29, 2010.
European Patent Office, European Search Report issued in related European application No. EP 10 17 3591 dated Jan. 19, 2011.

* cited by examiner

*Primary Examiner* — Aditya Bhat
(74) *Attorney, Agent, or Firm* — Patterson & Sheridan, LLP

(57) ABSTRACT

Method, system, and computer readable medium for determining a fault in a power filter of a wind turbine generator. The method may include the steps of calculating a reactive power consumed by the power filter, and comparing the calculated reactive power to a predefined threshold reactive power to determine the fault.

16 Claims, 6 Drawing Sheets

SYSTEM AND METHOD FOR MONITORING POWER FILTERS AND DETECTING POWER FILTER FAILURE IN A WIND TURBINE ELECTRICAL GENERATOR

CROSS-REFERENCE TO RELATED APPLICATIONS

The present application claims the benefit of U.S. Provisional Application No. 61/235,839, filed Aug. 21, 2009, and claims priority under 35 U.S.C. §119 to Danish Patent Application 2009-70094, filed Aug. 21, 2009. The content of each of these applications is hereby incorporated by reference herein in its entirety for all purposes.

FIELD OF INVENTION

This application relates to monitoring the performance of power filters in power generations systems, such as high capacity wind turbines, and detecting power filter faults or failures in such systems.

BACKGROUND

Power generation systems typically convert one source of power into electrical energy by turning a rotor of an electrical generator. Power is supplied at a specific voltage and frequency to an electrical grid, which then transmits the power to the consumer. In order to ensure that the power is supplied at a constant voltage and frequency, various control devices/equipment may be used. Ensuring that power is provided at the desired voltage and frequency may be particularly challenging for wind turbine generators, which do not turn the rotor of the generator at a constant speed. The power produced by the turbine must be converted to stable electrical power for transmission.

For example, one prior art wind turbine generator provides a full power converter having a generator side active rectifier coupled to a grid side active inverter via a direct current (DC) link. In this configuration, the active rectifier converts variable frequency alternating current (AC) signals from the generator into a DC voltage, which is placed on the DC link. The active inverter converts the DC voltage on the DC link into fixed frequency AC power for a power grid. Such a configuration requires complicated and expensive circuitry utilizing active switches (e.g., insulated-gate bipolar transistors (IGBTs)) for the active rectifier and inverter. These types of active switches typically have higher power loss during power conversion, and may cause unwanted high frequency harmonics on the power grid.

For example, the grid converter may generate switching frequency harmonics at a frequency of 5 kHz. A grid-side harmonic filter (grid filter) may be used to provide a path for the switching frequency harmonics and prevent the undesired transmission of the switching frequency harmonics to the grid utility. The grid filter may be a capacitor bank that accumulates electrical energy at a variable rate, and discharges the energy at a controlled rate. The grid filter may be connected to the grid side using, for example, a fuse.

One problem associated with currently available wind turbines is that when one or more of the fuses of the grid filter blow, or some other component of the grid filter fails, the grid filter cannot function properly. In some of these currently available systems, when the grid filter fuse blows, there is no feedback signal provided to the wind turbine control system. As a result, the wind turbine will continue to supply power to the grid without the grid filter. This in turn may cause other problems, such as an over-voltage fault alarm or problems connecting to the grid. This problem may be exacerbated in electrical grids that may suffer from poor overall control.

One solution to this problem is to provide various electrical components directly connected to the grid filter to monitor the filter for failures, and report these failures to an operator via the control system. However, in current systems, it may be difficult to find components which are easy to install and service, and which meet various regulatory requirements.

It would therefore be an improvement in the art if a system and method could be developed to overcome one or more of the problems described above.

SUMMARY

One aspect of the present invention provides a method for determining a fault in a power filter of a wind turbine generator. The method may include the steps of: calculating a reactive power consumed by the power filter; and comparing the calculated reactive power to a predefined threshold reactive power to determine said fault.

In some embodiments, the calculated reactive power may be based on a measured value of a converter leg current, and one of a converter leg voltage for each phase wire of the wind turbine generator. The step of calculating the reactive power consumed by the power filter may include calculating an average reactive power consumed by a grid converter leg of the wind turbine generator over a period of time.

In further embodiments, the step of calculating the average reactive power consumed by a grid converter leg may further include adjusting the average reactive power consumed by the grid converter leg by a voltage factor to determine an adjusted average reactive power consumed by the grid converter leg. The measured values may be obtained substantially at a transition from a pre-charge state to a run state of the wind turbine generator/

In alternate embodiments, the step of calculating the reactive power consumed by the power filter may further include: calculating an adjusted average reactive power consumed at said pre-charge state by an auxiliary power supply of the wind turbine generator; calculating an adjusted average reactive power consumed by both the auxiliary power supply and the power filter in said run state; and calculating the average reactive power consumed by the grid filter alone based on the values of the average reactive power consumed by the auxiliary power supply and the average reactive power consumed by both the auxiliary power supply and the power filter.

In this embodiment, the step of calculating an adjusted average reactive power consumed by said auxiliary power supply at said pre-charge state may further include: connecting a DC link capacitor to a converter leg of said wind turbine generator, pre-charging said DC link capacitor while said power filter is disconnected; and obtaining said measured values during said pre-charge state. The step of calculating an adjusted average reactive power consumed by both the auxiliary power supply and the power filter in said run state may further include: electrically connecting said power filter; providing a time delay; calculating said adjusted average reactive power consumed by both the auxiliary power supply and the power filter over said period of time; and disconnecting said DC link capacitor.

In some embodiments, the power filter may be one of a grid-side power filter, a machine side dv/dt filter, or a stator filter, and said fault may be at least one of a failure in a fuse, a failure in a capacitor, or a failure in a connection of said power filter. One fundamental cycle may be 0.02 seconds and the period of time may be one or more fundamental cycles.

An alternate aspect of the present invention provides a system for detecting a fault in a power filter of a wind turbine generator, the system comprising: a computer processor; and a plurality of sensors electrically connected to said wind turbine generator and said computer processor; wherein said computer processor is configured to: calculate a reactive power consumed by the power filter based on data from said sensors; and compare the calculated reactive power to a predefined threshold reactive power to determine said fault.

In alternate embodiments of the system, the sensors may provide a measured value of a converter leg current, and one of a converter leg voltage and a stator leg voltage for each phase wire of the wind turbine generator. The processor may further calculate an average reactive power consumed by a grid converter leg of the wind turbine generator over a period of time.

In other embodiments, the processor may further calculate an average reactive power consumed by a grid converter leg by adjusting the average reactive power consumed by the grid converter leg by a voltage factor to determine an adjusted average reactive power consumed by the grid converter leg. The measured values may be obtained substantially at a transition from a pre-charge state to a run state of the wind turbine generator.

In some embodiments, the processor may calculate the reactive power consumed by the power filter by: calculating an adjusted average reactive power consumed at said pre-charge state by an auxiliary power supply of the wind turbine generator; calculating an adjusted average reactive power consumed by both the auxiliary power supply and the power filter in said run state; and calculating the average reactive power consumed by the grid filter alone based on the values of the average reactive power consumed by the auxiliary power supply and the average reactive power consumed by both the auxiliary power supply and the power filter.

In further embodiments, the processor may calculate said adjusted average reactive power consumed by said auxiliary power supply at said pre-charge state by: connecting a DC link capacitor to a converter leg of said wind turbine generator; pre-charging said DC link capacitor while said power filter is disconnected; and obtaining said measured values during said pre-charge state. The processor may calculate said adjusted average reactive power consumed by both the auxiliary power supply and the power filter in said run state by: electrically connecting said power filter; providing a time delay; calculating said adjusted average reactive power consumed by both the auxiliary power supply and the power filter over said period of time; and disconnecting said DC link capacitor. One fundamental cycle may be 0.02 seconds and the period of time may be one or more fundamental cycles.

A further aspect of the present invention provides a computer readable medium containing computer program code for determining a fault in a power filter of a wind turbine generator, the computer code being configured to: calculate a reactive power consumed by the power filter; and compare the calculated reactive power to a predefined threshold reactive power to determine said fault.

In some embodiments, the calculated reactive power may be based on a measured value of a converter leg current and a converter leg voltage/a stator leg voltage for each phase wire of the wind turbine generator. The step of calculating the reactive power consumed by the power filter may further include calculating an average reactive power consumed by a grid converter leg of the wind turbine generator over a period of time.

In alternate embodiments, the step of calculating the average reactive power consumed by a grid converter leg may further include adjusting the average reactive power consumed by the grid converter leg by a voltage factor to determine an adjusted average reactive power consumed by the grid converter leg. The measured values may be obtained substantially at a transition from a pre-charge state to a run state of the wind turbine generator.

In further embodiments, the step of calculating the reactive power consumed by the power filter may further include: calculating an adjusted average reactive power consumed at said pre-charge state by an auxiliary power supply of the wind turbine generator; calculating an adjusted average reactive power consumed by both the auxiliary power supply and the power filter in said run state; and calculating the average reactive power consumed by the grid filter alone based on the values of the average reactive power consumed by the auxiliary power supply and the average reactive power consumed by both the auxiliary power supply and the power filter.

In other embodiments, the step of calculating an adjusted average reactive power consumed by said auxiliary power supply at said pre-charge state may further include: connecting a DC link capacitor to a converter leg of said wind turbine generator; pre-charging said DC link capacitor while said power filter is disconnected; and obtaining said measured values during said pre-charge state. The step of calculating an adjusted average reactive power consumed by both the auxiliary power supply and the power filter in said run state may further include: electrically connecting said power filter; providing a time delay; calculating said adjusted average reactive power consumed by both the auxiliary power supply and the power filter over said period of time; and disconnecting said DC link capacitor.

The power filter may be one of a grid-side power filter, a machine side dv/dt filter, or a stator filter. The fault may be at least one of a failure in a fuse, a failure in a capacitor, or a failure in a connection of said power filter.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Embodiments of the present invention provide a system and method to alert an operator of an electrical generation system of a failure in a power filter without requiring the installation of additional hardware components. For the purposes of illustration, one embodiment of the present system and method will be described below with respect to a wind turbine generator producing three-phase power. However, it is understood that other types and sizes of generators, both single phase and multiple phase, may also be used, without departing from the scope of the present embodiments, as defined by the appended claims. By way of example, embodiments of the present invention may be used with doubly/singly fed induction generators, synchronous generators including permanent magnet (PM), interior permanent magnet (IPM), and surface mounted permanent magnet (SMPM) generators, asynchronous generators including induction generators (IG), squirrel cage generators, and other types of generators known to those of skill in the art. Full-scale electrical systems may also be considered.

Similarly, while the discussion below focuses on an example embodiment in which the power filter is a grid-side filter, it is understood that other types and locations of power filters may also be used with embodiments of the present invention. The method of determining a failure in a power filter may be applied to any filter in an electrical power generator, and more particularly a wind turbine generator. By way of example and not limitation, such filters may include machine side dv/dt filters, stator filters, or any other type of power filter that is capable of filtering out the switching frequency harmonics. For the purpose of discussion, the term "grid filter" used below applies to all such power filters.

Figure 1:
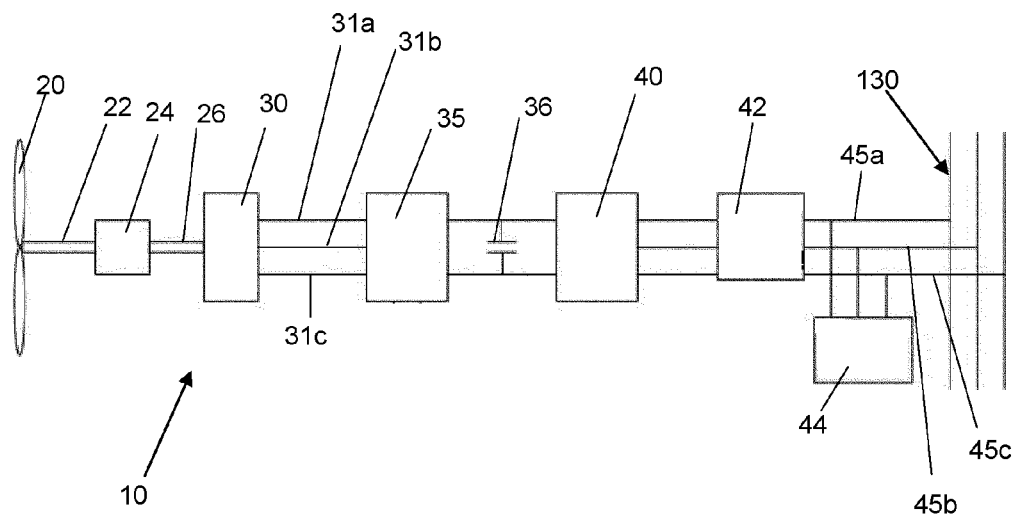
FIG. 1 illustrates a simplified schematic diagram of a wind turbine generator in which embodiments of the present invention may be used to determine a power filter failure.

FIG. 1 illustrates a simplified schematic diagram of a wind turbine generator (WTG) system 10 in which embodiments of the present invention may be used to determine a power filter failure. The WTG system 10 may be a PM, IPM, SMPM or IM system as described above. The WTG system 10 includes a rotor blade 20 connected by an input shaft 22 to an optional gearbox 24. The gearbox 24 is connected via an output shaft 26 to a WTG 30, which converts the rotary motion of the rotor blade 20 into electric power. The optional gearbox 24 may be used to increase the rotational speed of the output shaft 26.

In this embodiment, the WTG 30 is configured to supply power to a fixed-frequency (typically 50 or 60 Hz) power grid 130. One way for the WTG 30 to provide synchronized power to the grid 130 would be to ensure that the rotor blade 20 turns at a constant speed. However, in order to provide higher efficiency in the production of electricity, the speed of the rotor blade 20 may be allowed to vary within a certain range. This allows the rotor blade 20 to rotate at an optimum speed for any given wind speed. The WTG 30 may thus produce AC power that is not synchronised with the power grid 130.

To alleviate this problem, an AC/DC converter 35 may be connected to the stator windings of the WTG 30 via power lines 31a, 31b, and 31c. The AC/DC converter 35 converts the AC power output from the WTG 30 to DC power. The AC/DC converter 35 is connected via a filter capacitor 36 to a DC/AC converter 40, which converts the DC power to AC power that is synchronised with the power grid 130. In some configurations, a transformer (not shown) may be placed between the DC/AC converter 40 and the grid 130. One or more power filters 42 and/or grid filters 44 may be electrically connected to the output power lines 45a, 45b, and 45c, which connect to the transformer and the grid 130.

Figure 2:
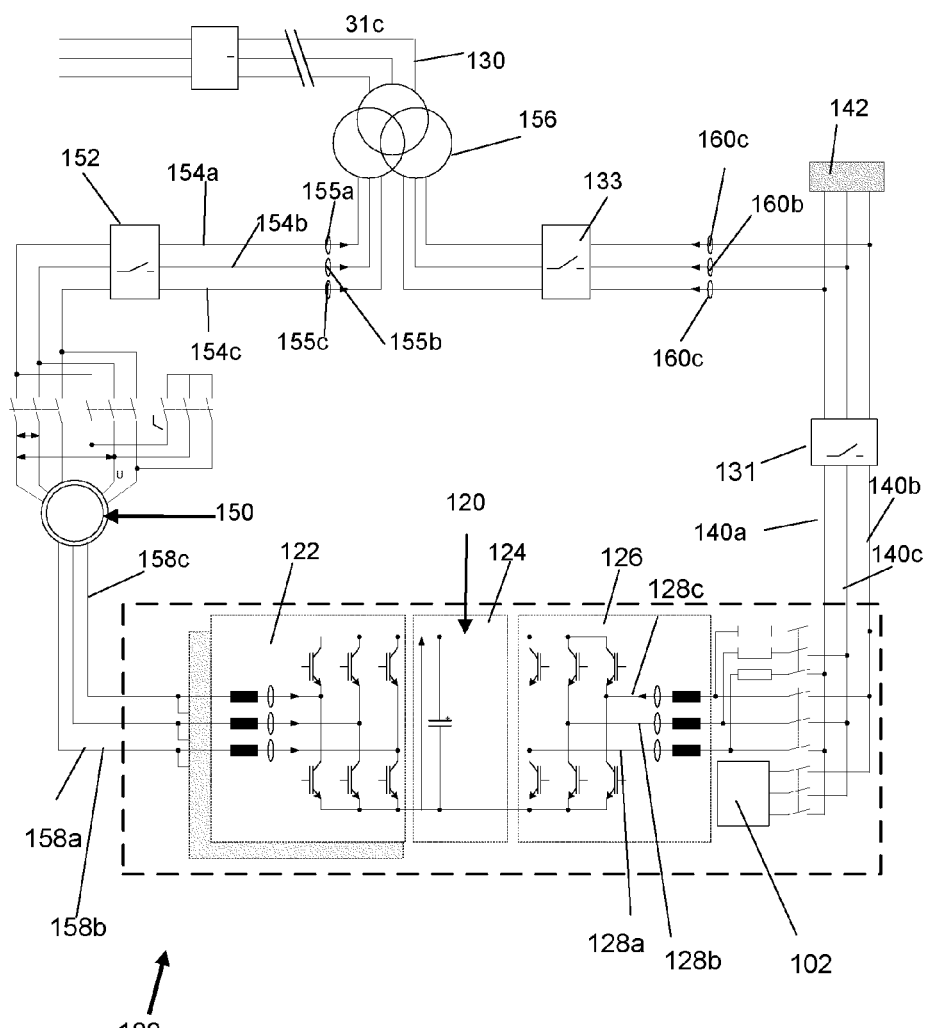
FIG. 2 illustrates a circuit diagram of a wind turbine generator in which embodiments of the present invention may be used to determine a power filter failure.

FIG. 2 illustrates a circuit diagram 100 of a wind turbine generator 150 in which embodiments of the present invention may be used to determine the status of a grid filter 102 and to report any failure in the grid filter 102 to an operator of the system. In this embodiment, the WTG 150 is a doubly fed induction generator (DFIG). However, as outlined above, it is understood that embodiments of the present invention may be used with any type of WTG. The DFIG WTG 150 includes a stator (not shown) having a three phase winding which is connected through a circuit breaker 152 via power lines 154a, 154b and 154c directly to the transmission grid 130 through a step up voltage transformer 156. The current on the power lines 154a, 154b, 154c flowing into the main electrical grid 130 may be measured using pre-existing transducers 155a, 155b and 155c. In the discussion which follows, power lines 154a, 154b and 154c form the "stator leg", and the current measured using transducers 155a, 155b, and 155c will be known as the stator leg current. It is understood that other types and locations of measurement devices that function to measure the stator leg current and/or the stator leg voltage may also be used. The three phase rotor winding (not shown) is connected via a slip ring and brush assembly (not shown) to the rotor side of a power converter 120 via power lines 158a, 158b and 158c.

The power converter 120 includes an AC/DC machine-side rectifier 122, a DC-link 124, and a DC/AC grid inverter 126. The grid filter 102 is connected to the output of the grid inverter 126 via power lines 128a, 128b, and 128c. The three phase filtered power is then provided through a first circuit breaker/switch 131 and a second circuit breaker/switch 133 to the transformer 156 and the main electrical grid 130 via power lines 140a, 140b and 140c. A wind turbine auxiliary power supply 142 may be provided to power certain components in the wind turbine under some circumstances. The auxiliary power supply 142 may consume power from the main grid 130, or from the grid inverter 126. The current on the power lines 140a, 140b, 140c flowing into the main electrical grid 130 may be measured using pre-existing transducers 160a, 160b and 160c. In the discussion which follows, power lines 140a, 140b and 140c form the "grid converter leg", and the current measured using transducers 160a, 160b, and 160c will be known as the converter leg current. This will be discussed in more detail below. It is understood that other types and locations of measurement devices that function to measure the converter leg current and/or the converter leg voltage may also be used.

In this embodiment, the circuit breaker/switch 131 may be used to disconnect the power output from the power converter 120 during a fault or other condition. Similarly, the circuit breaker/switch 133 may be used to disconnect the power output from the power converter 120 and auxiliary power supply 142 from the main grid 130 during a fault or other condition.

Figure 3:
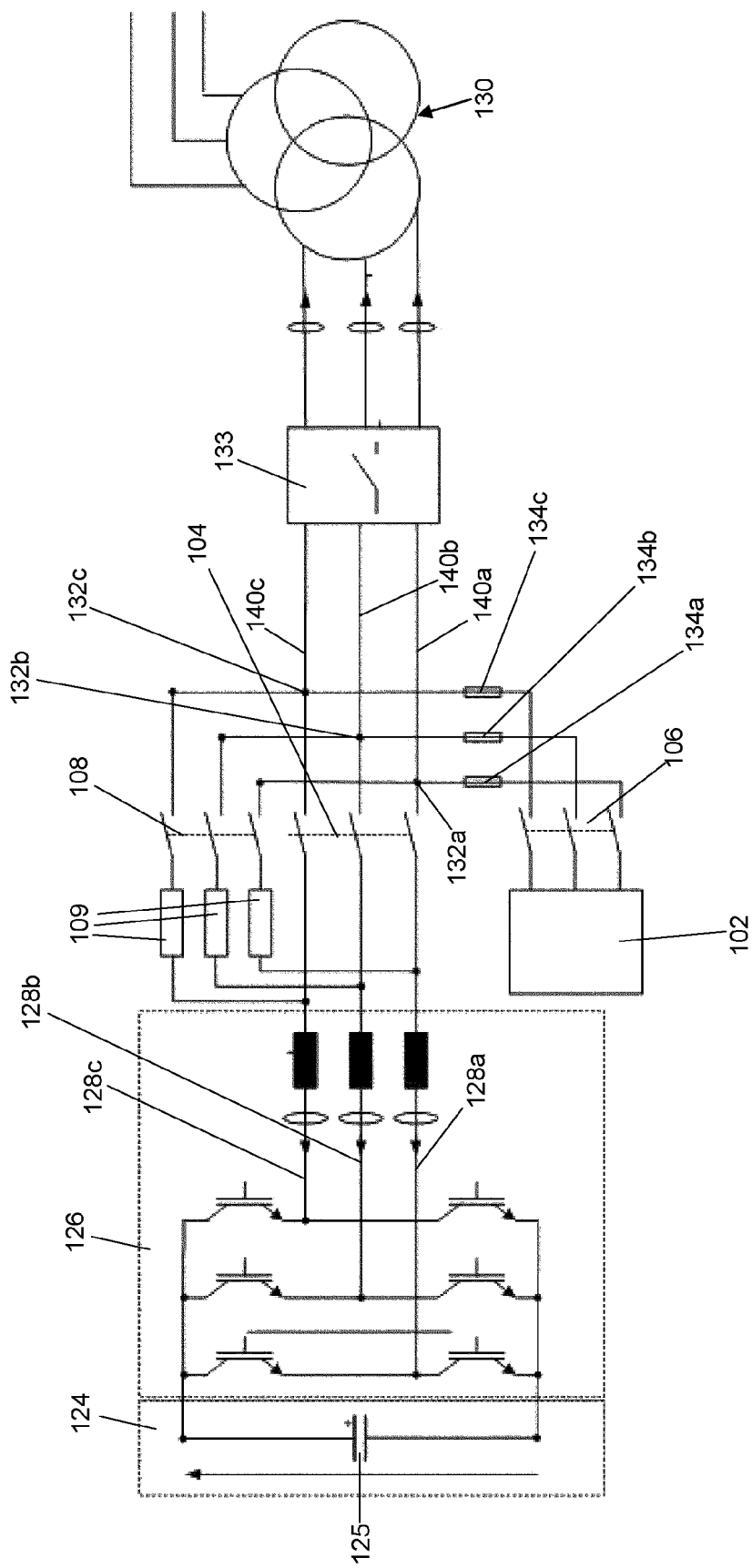
FIG. 3 illustrates a close-up view of a portion of the circuit diagram of FIG. 2 showing the grid inverter and power filter.

FIG. 3 illustrates a close-up view of the grid inverter 126 and grid filter 102 shown in FIG. 2. In this embodiment, the grid filter 102 is installed between the grid chokes/connector switches 104, 106 and the circuit breaker 133. The grid filter 102 is connected to point 132c, 132b, and 132a on power lines 140c, 140b, and 140a through grid fuse 134c, 134b, and 134a, respectively. A pre-charge circuit, illustrated as switch 108 and pre-charge resistors 109 may be used to power up a DC link capacitor 125 within the DC link 124 prior to generator startup or connection of the machine-side converter. During pre-charge, the switches 104, 106 are disconnected. During normal operation, once the voltage measured across the DC Link capacitor 125 reaches a target value, switches 104 and 106 are switched on, and switch 108 is switched off. However, the method of the present invention allows switch 108 to remain on for a period of time. This will be discussed in much greater detail below.

Figure 4A:
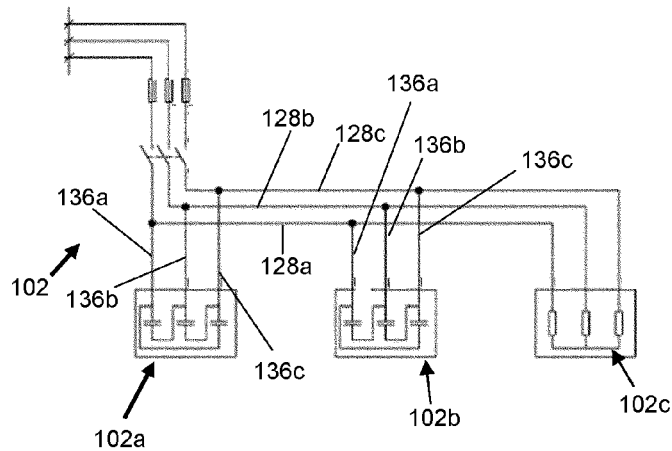
FIG. 4A illustrates a schematic diagram of one embodiment of a grid filter shown in FIGS. 2 and 3.

One example of a schematic diagram for the grid filter 102 is shown in FIG. 4A. In this embodiment, the grid filter 102 includes a first capacitor bank 102a, a second capacitor bank 102b, and a discharge coil 102c. Each capacitor bank 102a, 102b is electrically connected to the power lines 128a, 128b, and 128c via output lines 136a, 136b, and 136c respectively. Similarly, the discharge coil 102c is electrically connected to the power lines 128a, 128b, and 128c. When the grid filter 102 is switched off for any reason, any residual DC voltage remaining in the capacitors 102a, 102b may be discharged very quickly through the discharge coil 102c. This helps to ensure a short reconnect time when the grid filter 102 is switched back on.

It is understood that other configurations of the grid filter 102 may also be used. For example, the grid filter 102 may include one or more capacitor banks, which may be connected in different configurations. The capacitors used in the capacitor banks may be self healing. All such configurations for the grid filter 102 are deemed to fall within the scope of the appended claims, provided that these configurations function to filter the supplied power including, but not limited to, the switching frequency harmonics.

Figure 4B:
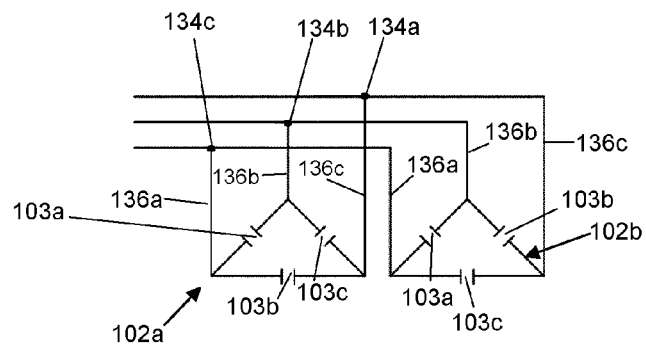
FIG. 4B illustrates a schematic diagram showing a normal operating mode for the grid filter of FIG. 4A.

FIG. 4B illustrates the normal operating mode for the grid filter 102 shown in FIG. 4A. In the normal operating mode, all three-phase grid filters 102a, 102b have been connected, and none of grid filter fuses are blown.

Figures 4C, 4D, 4E:
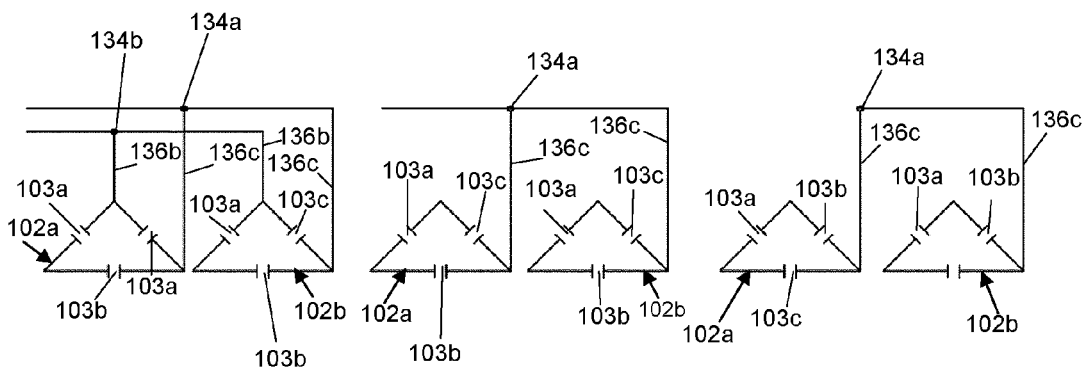
FIG. 4C illustrates a schematic diagram showing one possible failure mode for the grid filter of FIG. 4A.
FIG. 4D illustrates a schematic diagram showing an alternate possible failure mode for the grid filter of FIG. 4A.
FIG. 4E illustrates a schematic diagram showing another alternate possible failure mode for the grid filter of FIG. 4A.

FIGS. 4C-4E illustrate grid filter 102 failure modes. The failure mode for the self healing type capacitors 102a, 102b used in the grid filter 102, is normally a slow degrading of the capacitance, i.e. the capacitance will decrease over time. Common failure modes for the grid filter 102 may include a failure of one or more of the fuses 134a, 134b, 134c, or the contactors. FIG. 4C illustrates the case in which one of the grid filter fuses/contactors (134c) fails resulting in the disconnection of one of the capacitors 103a. FIG. 4D illustrates the case in which two of the grid filter fuses/contactors fail (134b, 134c) resulting in the disconnection of two of the capacitors 103a, 103b. FIG. 4E illustrates the case in which all of the grid filter fuses/contactors fail resulting in the disconnection of all of the capacitors 103a, 103b, 103c. For the purposes of the discussion which follows, when the grid filter 102 works properly, all three-phase grid filter branches are working and none of the grid filter fuses/contactors/capacitors are blown. Grid filter failure may include any fuse failure, any grid filter contactors failure, any capacitors failure, or any other failure of a component in the grid filter 102.

In an alternating current electrical system, the term "reactive power" is used to represent the energy alternately stored and released by inductors and/or capacitors. In the present embodiments, an instantaneous reactive power concept may be used. The instantaneous reactive power consumed by the grid filter 102 shown in FIGS. 4A-4E is discussed below with reference to Equations 1-4.

For the purpose of discussion, it is assumed that the grid voltage varies within a range of 0.8 power units (p.u.) and 1.2 p.u. Therefore, given that the reactive power is calculated as the square of the voltage units, the reactive power under normal mode is within a range of 0.64 $Q_{nom}$-1.44 $Q_{nom}$.

For the failure mode illustrated in FIG. 4C, the reactive power consumed by the grid filter 102 is approximately half of the reactive power consumed under the normal mode. Therefore, the range of reactive power in this case is 0.32*$Q_{nom}$-0.72*$Q_{nom}$. For the failure modes illustrated in FIGS. 4D and 4E, the reactive power consumed by the grid filter 102 is zero.

For purposes of illustration, it is assumed that the capacitors 103a-103c are rated at 56 KVar at a voltage of 440V, and the nominal voltage of the grid tapping is 400V (Line-Line), with a nominal frequency of either 50 Hz or 60 Hz, depending on the location of the grid. The value of the nominal voltage $Q_{nom}$ may then be computed using the following formula:

$$Q_{nom} = Cap*(V_{cap}/V_{grid})^2 \qquad (A)$$

where Cap is the capacitor rating, $V_{cap}$ is the voltage rating of the capacitor, and $V_{grid}$ is the nominal voltage rating of the grid.

The value of $Q_{nom}$ for the capacitor 102 would thus be 46.44 kVar at nominal voltage for the generator discussed herein. However, it is understood that the value of $Q_{nom}$ may change depending on the type of capacitors used, the capacity of the wind turbine generator, the line-line voltage, etc.

Embodiments of the system and method of the present invention provide a means to measure the reactive power consumed by the grid filter 102 during each of the modes discussed above, using only existing inputs. The measurements may then be used to determine a failure mode of the grid filter 102, which is then reported to a supervision system that generates an alarm if the grid filter 102 fails. The measurements are accomplished by comparing the mean values of the reactive power before and after switches 104 and 106 are closed. One assumption being made here is that the auxiliary power supply 142 is not cycled on and off during the failure detecting process.

Figure 5:
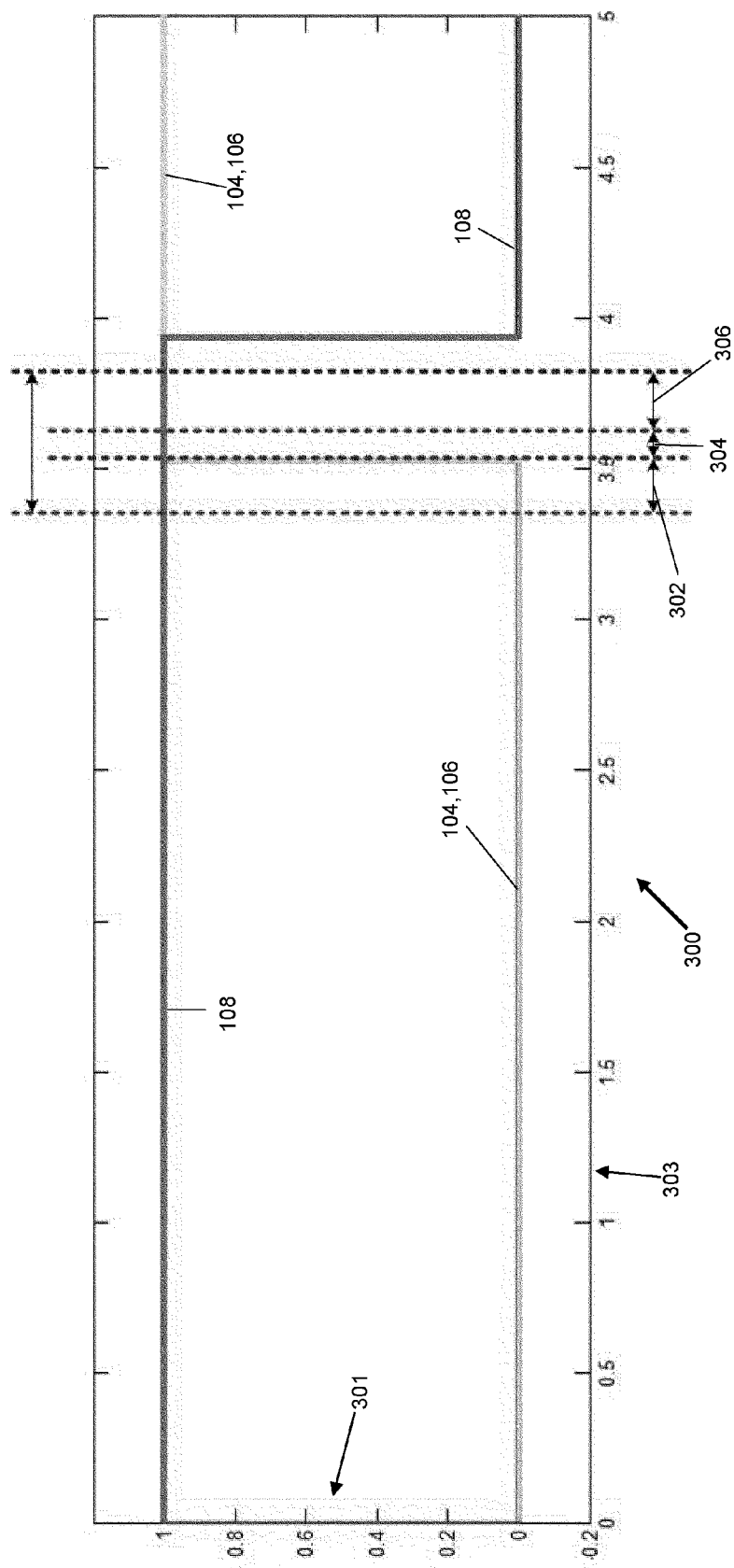
FIG. 5 is a graph illustrating one possible implementation of a detection process that may be used with the system and method of the present invention.
Figure 6:
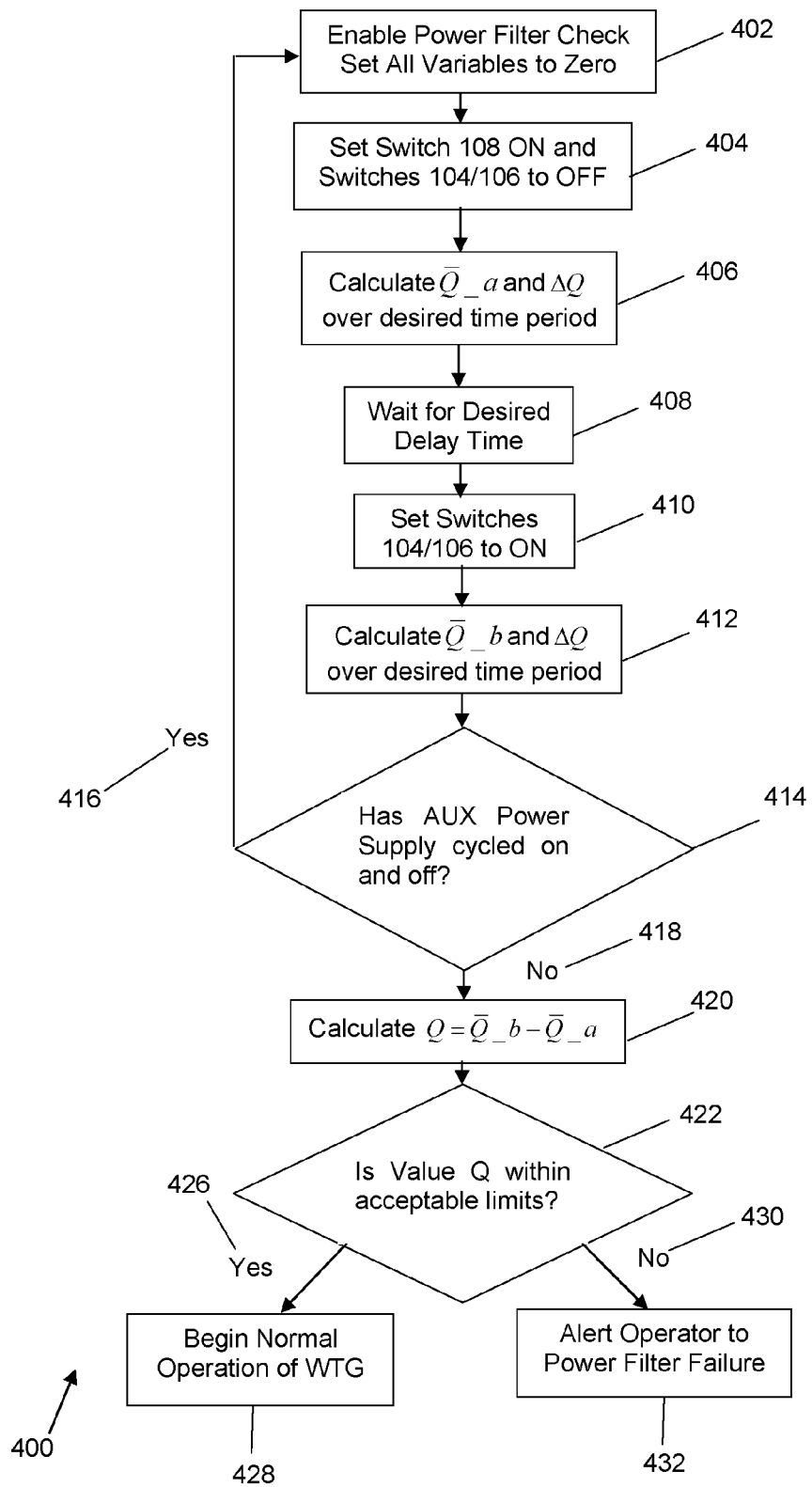
FIG. 6 illustrates a flow chart showing one possible implementation of the method of the present invention.

FIG. 5 is a graph illustrating one possible implementation of a detection process, designated generally as reference numeral 300, which may be used with the system and method of the present invention. FIG. 6 illustrates a flow chart, designated generally as reference numeral 400, showing one possible implementation of the method of the present invention.

In this embodiment, the various signals available to monitor and detect grid filter 102 failures are summarised in Table 1 below:

TABLE 1

| | |
|---|---|
| Main Grid Converter leg transducer Il1 | MGC_IL1 |
| Main Grid Converter leg transducer Il2 | MGC_IL2 |
| Main Grid Converter leg transducer Il3 | MGC_IL3 |
| Main Grid Statorleg transducer UL1 | MGS_UL1 |
| Main Grid Statorleg transducer UL2 | MGS_UL2 |
| Main Grid Statorleg transducer UL3 | MGS_UL3 |
| Main Grid Converterleg transducer Ul1 | MGC_UL1 |
| Main Grid Converterleg transducer Ul2 | MGC_UL2 |
| Main Grid Converterleg transducer Ul3 | MGC_UL3 | where MGC_ILx represents the current sent to the grid 130 on the grid converter leg, measured, for example, using transducers 160a, 160b and 160c, and including the current from the grid converter 126 and the current from the auxiliary power supply 142; and MGS_ULx are the voltages of the stator leg measured at a point between the switch 152 and the high voltage transformer 156. MGC_ULx represents the voltages of the each phase wire of the gird converter leg, and may be measured with voltage sensors located near transducers 160. It is understood that other measurement points may also be used.

The reactive power q consumed on the grid converter leg may then be calculated using Formula 1 as follows:

$$q = \frac{1}{\sqrt{3}}[(\text{MGC\_UL1} - \text{MGC\_UL2}) \cdot \text{MGC\_IL3} + \qquad (1)$$
$$(\text{MGC\_UL2} - \text{MGC\_UL3}) \cdot \text{MGC\_IL1} +$$
$$(\text{MGC\_UL3} - \text{MGC\_UL1}) \cdot \text{MGC\_IL2}]$$
$$= 1.5(\text{MGC\_v}_\beta \cdot \text{MGC\_i}_\alpha - \text{MGC\_v}_\alpha \cdot \text{MGC\_i}_\beta)$$

where, MGC_ILx and MGC_ULx are defined above for the grid converter leg in the a-b-c original frame, MGC_$v_\alpha$ and MGC_$v_\beta$ denote the main grid converter leg voltages in α-β frame, and MGC_$i_\alpha$ and MGC_$i_\beta$ denote the main grid converter leg currents in α-β frame wherein:

$$\begin{bmatrix} \text{MGC\_i}_\alpha \\ \text{MGC\_i}_\beta \end{bmatrix} = \frac{2}{3} \begin{bmatrix} 1 & -0.5 & -0.5 \\ 0 & \sqrt{3}/2 & -\sqrt{3}/2 \end{bmatrix} \begin{bmatrix} \text{MGC\_IL1} \\ \text{MGC\_IL2} \\ \text{MGC\_IL3} \end{bmatrix} \qquad (2)$$

$$\begin{bmatrix} \text{MGC\_v}_\alpha \\ \text{MGC\_v}_\beta \end{bmatrix} = \frac{2}{3} \begin{bmatrix} 1 & -0.5 & -0.5 \\ 0 & \sqrt{3}/2 & -\sqrt{3}/2 \end{bmatrix} \begin{bmatrix} \text{MGC\_UL1} \\ \text{MGC\_UL2} \\ \text{MGC\_UL3} \end{bmatrix} \qquad (3)$$

$$\begin{bmatrix} \text{MGC\_UL1} \\ \text{MGC\_UL2} \\ \text{MGC\_UL3} \end{bmatrix} = \text{turn.ratio} \begin{bmatrix} \text{MGS\_UL1} \\ \text{MGS\_UL2} \\ \text{MGS\_UL3} \end{bmatrix} \qquad (4)$$

Formula 4 may be required in cases in which the voltage sensors for directly measuring the value of MGC_ULx are not available. The value of MGS_ULx represents the stator leg voltages as measured, and are multiplied by the turn ratio of the transformer 156 to determine MGC_ULx. In some embodiments, the definition of q in the a-b-c frame may be used. Alternately, the transformation to the α-β frame may be used.

In an embodiment, the WTG system is a full scale electrical system and the generator electrical output is provided into a back-to-back power converter which is thereafter coupled to a grid filter. Direct measurements of a current and a voltage of a grid converter leg are measured to determine the reactive power consumption of the grid filter.

With continuing reference to FIG. 6, the method 400 begins with a first step of enabling the power filter check and setting all of the variables to zero, as shown with reference numeral 402. This enabling step may be accomplished, for example, when an operator of the system initiates a software program on one or more control microprocessors that receive data from, and provide various control functions to, the system.

As discussed above, the method 400 uses the average values of the reactive power. In order to determine the average values for the reactive power, a sampling period should be determined. For purposes of illustration, we will use 100 microseconds (μs) as the sampling period. It is understood that other sampling periods may also be used. Using a sampling period of 100 μs, the average reactive power of the grid converter leg in a fundamental cycle (0.02 seconds) may be computed as:

$$\bar{q} = \int q \, dt \qquad (5)$$

$$= \frac{1}{200} \sum_{i=1}^{200} q(i)$$

In this embodiment, the reactive power calculated in Equations (1) and (5) includes both the reactive power consumed by the wind turbine auxiliary power supply 142 and by the grid filters 102 (see FIG. 1). In order to determine the reactive power consumed by the grid filter 102 alone, there are a number of factors to consider.

First, it may be noted that there is an overlap area between the normal case (FIG. 4B) and the first failure case (FIG. 4C). As previously discussed, the reactive power consumed by the grid filter in the normal mode is between 0.64 $Q_{nom}$-1.44 $Q_{nom}$. The reactive power consumed by the grid filter in the first failure case is half of the reactive power consumed in the normal mode, i.e. between 0.32 $Q_{nom}$-0.72 $Q_{nom}$. To compensate for the overlap in these ranges, a voltage factor may be introduced in the average reactive power computation (Equation 5) to eliminate the effect of grid voltage variations. This may be shown as:

$$\bar{Q} = \bar{q} \cdot U_{factor} \qquad (6)$$

where $\bar{Q}$ is the adjusted average reactive power of the grid converter leg, and the voltage factor $U_{factor}$ is defined as:

$$U_{factor} = \frac{U_{Nom}^2}{[(\text{UL1\_RMS})^2 + (\text{UL2\_RMS})^2 + (\text{UL3\_RMS})^2]/3} \qquad (7)$$

$$\text{UL1\_RMS} = \sqrt{\frac{1}{200} \sum_{i=1}^{200} [\text{MGC\_UL1}(i)]^2} \qquad (8)$$

$$\text{UL2\_RMS} = \sqrt{\frac{1}{200} \sum_{i=1}^{200} [\text{MGC\_UL2}(i)]^2} \qquad (9)$$

$$\text{UL3\_RMS} = \sqrt{\frac{1}{200} \sum_{i=1}^{200} [\text{MGC\_UL3}(i)]^2} \qquad (10)$$

and $U_{nom}$ is the nominal grid voltage.

The second factor to consider is the fact that the values of $\bar{q}$ and $\bar{Q}$ calculated above are dependent on the specific electrical circuit configuration shown in FIGS. 1 and 2.

The reactive power q and Q could contain reactive power consumed by both the auxiliary power supply 142 and the grid filter 102. To obtain the reactive power consumed by the grid filter 102 alone, the reactive power before and after switches 104 and 106 are closed may be calculated and compared. Two different stages, Stage a and Stage b, which provide a transition between a "pre-charge" state and a "run" state for the wind turbine generator, are considered below.

In Stage a, the switch 108 is set to ON, and switches 104 and 106 are OFF, as shown with reference numeral 404 in FIG. 6. The DC-link capacitor 125 (FIG. 3) is then charged through one or more pre-charge resistors 109. During this stage, the values of the reactive power q and Q include only the reactive power consumed by the wind turbine auxiliary power supply 142.

In Stage b, when the DC-link voltage reaches a certain voltage, for example 500V, switches 104 and 106 are turned on and the grid filter 102 is connected. During this "run" stage, the values of the reactive power q and Q include both the reactive power consumed by the wind turbine auxiliary power supply 142 and by the grid filter 102.

In this embodiment, if the auxiliary power supply 142 consumes the same amount of reactive power during Stage a and Stage b, the reactive power difference between Stage a and Stage b is the reactive power consumed by the grid filter 102. However, the auxiliary power supply 142 may not always consume the same amount of reactive power in both stages. For example, during normal operation, the wind turbine generator may yaw automatically to keep the nacelle directly upwind. A cooling system (not shown) may be automatically engaged to cool the power generator 120. Therefore, there is a possibility that some auxiliary power from the auxiliary power supply 142 will be required during Stage b. Thus, the reactive power difference between Stage a and Stage b may not represent the reactive power consumed by the grid filter 102.

To reduce the possibility that the auxiliary power supply 142 is cycled on and off during the grid filter failure detection process, and obtain the grid filter reactive power, the detecting process may be made both continuous and short, and the consistency of the data may be checked. With reference to FIG. 5 the graph 300 shows the on-off states of switches 104, 106 and 108 on the left axis 301 plotted against time in seconds on the lower axis 303. Note that switches 104 and 106 are engaged simultaneously to connect the grid filter 102. However, it is understood that various electrical configurations including a greater or lesser number of switches may also be used.

As illustrated in the graph 300, right before switches 104 and 106 are turned on, and while switch 108 is turned on, 10 fundamental-cycle reactive power data may be processed to obtain an average value of the reactive power during Stage a ($\overline{Q}\_a$), as shown with reference numeral 302 in FIG. 5, and reference numeral 406 in FIG. 6. It is understood that a greater or lesser number of fundamental cycles may also be used as a desired time period. The calculation of the value of $\Delta Q$ shown in step 406 is discussed in more detail below.

Following that, a 0.1 second time delay may be inserted to avoid the transient period associated with the closing of switches 104 and 106, as shown with reference numeral 304 in FIG. 5, and reference numeral 408 in FIG. 6. It is understood that other values for the desired time delay, both longer and shorter than 0.1 second, may also be used. Next, switches 104 and 106 are turned on, as shown with reference numeral 410.

Thereafter, another 10 fundamental-cycle of reactive power data may be processed to obtain an average value of the reactive power during stage b ($\overline{Q}\_b$), as shown with reference numeral 306 in FIG. 5, and reference numeral 412 in FIG. 6. The calculation of the value of $\Delta Q$ shown in step 412 is discussed in more detail below. For this example, only 0.5 seconds are thus required for the entire detecting process. It is understood, as discussed above, that other time periods, time delays and numbers of cycles, both shorter and longer, may also be used.

In order to determine that the auxiliary power supply 142 has not cycled on and off during the monitoring process, as shown with reference numeral 414, the consistency of the two sets of 10-fundamental-cycle data may be checked. The procedure to check the data is discussed below.

The average value of one-fundamental-cycle data may be defined as $$\{\overline{Q}\_a_1 \ldots \overline{Q}\_a_{10}\} \text{ and} \tag{11}$$

$$\{\overline{Q}\_b_1 \ldots \overline{Q}\_b_{10}\} \tag{12}$$

where, $\overline{Q}\_a_1 \sim \overline{Q}\_a_{10}$ and $\overline{Q}\_b_1 \sim \overline{Q}\_b_{10}$ are calculated based on Equation 6 defined above.

To determine that the auxiliary power supply 142 has not cycled on and off during the detecting process, the following equations should be satisfied:

$$|\{\overline{Q}\_a_i - \overline{Q}\_a_k\}| \leq \Delta Q \quad i,k=1\sim10 \tag{13}$$

$$|\{\overline{Q}\_b_i - \overline{Q}\_b_k\}| \leq \Delta Q \quad i,k=1\sim10 \tag{14}$$

$$|\{\overline{Q}\_b - \overline{Q}\_a\}| \in [Q\_\text{Min } Q\_\text{Max}] \tag{15}$$

where the average reactive power for stage a and stage b are $$\overline{Q}\_a = \frac{1}{10}\sum_{i=1}^{10} \overline{Q}\_a_i \tag{16}$$

$$\overline{Q}\_b = \frac{1}{10}\sum_{i=1}^{10} \overline{Q}\_b_i. \tag{17}$$

and $\Delta Q$ and [$Q\_\text{Min } Q\_\text{Max}$] are values selected by the operator of the wind turbine generator. By way of example and not limitation, $\Delta Q$ could be selected as $0.05\, Q_{nom}$ and [$Q\_\text{Min } Q\_\text{Max}$] could be selected as [$-0.2\, Q_{nom}\, 1.2\, Q_{nom}$]. Note that the values for $\Delta Q$ are calculated during steps 406 and 412 as discussed above.

If Equations 13-15 are not satisfied, then the auxiliary power supply 142 has cycled on and off during the detecting process. In this case, the power filter check may be terminated, as shown with reference numerals 416 and 417.

If Equations 13-15 are satisfied, the auxiliary power supply 142 has not cycled on and off during the detecting process, as shown with reference numeral 418. The average reactive power consumed by the grid filter is then obtained as $$Q = \overline{Q}\_b - \overline{Q}\_a \tag{18}$$

as shown with reference numeral 420.

The value for the reactive power Q calculated above may then be compared to a desired value, i.e. a threshold reactive power, to determine if a power filter fault has been detected, as shown with reference numeral 422. By way of example and not limitation, a fault condition may be generated if:

$$Q \leq 0.75 Q_{nom} \tag{19}$$

where $Q_{nom}$ denotes the reactive power consumed under the normal operating mode with nominal grid voltage, as previously defined. It is understood that the specific percentage of $Q_{nom}$ that is to be used may be defined by the system administrator of the wind turbine generator, so that it can be easily adjusted during testing and operation. Similarly, a value of "$Q/Q_{nom}$" may be defined by the system administrator as well. Therefore, Equation 19 can be written as Equation 20 below:

$$\text{measured capacitor value in } p.u. = \tag{20}$$
$$\frac{Q}{Q_{nom}} \leq \text{Capacitor trip level in } p.u.$$

If Equation 20 is not satisfied, the value of Q is within acceptable limits, as shown with reference numeral 426. Normal operation of the WTG may then begin, as shown with reference numeral 428.

However, if Equation 20 is satisfied, a fault condition has been determined, as shown with reference numeral 430. An error message may then be sent to the operator such as "Filter capacitor value too low calculated to: xxxx p.u., has to be above xxxx p.u.", as shown with reference numeral 432.

In an embodiment, a diagnostic system is provided for the wind turbine system 10. The diagnostic system may comprise capabilities to test and diagnose the electrical system as well as individual components such as generators, transformers, contactors, filters, semiconductor switching devices and so on. Method 400, as described above, is used to monitor the grid filter 102 is implemented as part of the diagnostic system. A filter temperature monitoring scheme may also be implemented to complement method 400.

Other testing methods may also be used in such an electrical system diagnostic system, either for the grid filter 102, any other individual component, or for a collection of components. For example, enclosure temperature testing, electrical parameter monitoring, frequency response analysis, partial discharge detection, or any other testing scheme may be used as part of the diagnostic system. Such a diagnostic system may also comprise functionality such as control of certain individual components, or a collection of components in the system. The diagnostic system could also modify the power production of the wind turbine generator in response to certain faults detected, or to shut down the turbine pre-emptively. It may also have an input into the maintenance schedule of the wind turbine, bringing forward a maintenance call, in response to a determination that a component is close to failure.

Some portions of the description above are explicitly or implicitly presented in terms of algorithms and functional or symbolic representations of operations on data within a computer memory. These algorithmic descriptions and functional or symbolic representations are the means used by those skilled in the data processing arts to convey most effectively the substance of their work to others skilled in the art. An algorithm is here, and generally, conceived to be a self-consistent sequence of steps leading to a desired result. The steps are those requiring physical manipulations of physical quantities, such as electrical, magnetic or optical signals capable of being stored, transferred, combined, compared, and otherwise manipulated.

Unless specifically stated otherwise, and as apparent from the following, it will be appreciated that throughout the present specification, discussions utilizing terms such as "scanning", "calculating", "determining", "replacing", "generating", "initializing", "outputting", or the like, refer to the action and processes of a computer system, or similar electronic device, that manipulates and transforms data represented as physical quantities within the computer system into other data similarly represented as physical quantities within the computer system or other information storage, transmission or display devices.

The present specification also discloses apparatus, such as the processor 110, for performing the operations of the methods. Such apparatus may be specially constructed for the required purposes, or may comprise a general purpose computer or other device selectively activated or reconfigured by a computer program stored in the computer. The algorithms and displays presented herein are not inherently related to any particular computer or other apparatus. Various general purpose machines may be used with programs in accordance with the teachings herein. Alternatively, the construction of more specialized apparatus to perform the required method steps may be appropriate. The structure of a conventional general purpose computer will appear from the description below.

In addition, the present specification also implicitly discloses a computer program, in that it would be apparent to the person skilled in the art that the individual steps of the method described herein may be put into effect by computer code. The computer program is not intended to be limited to any particular programming language and implementation thereof. It will be appreciated that a variety of programming languages and coding thereof may be used to implement the teachings of the disclosure contained herein. Moreover, the computer program is not intended to be limited to any particular control flow. There are many other variants of the computer program, which can use different control flows without departing from the spirit or scope of the invention.

Furthermore, one or more of the steps of the computer program may be performed in parallel rather than sequentially. Such a computer program may be stored on any computer readable medium. The computer readable medium may include storage devices such as magnetic or optical disks, memory chips, or other storage devices suitable for interfacing with a general purpose computer. The computer readable medium may also include a hard-wired medium such as exemplified in the Internet system, or wireless medium such as exemplified in the GSM mobile telephone system. The computer program when loaded and executed on such a general-purpose computer effectively results in an apparatus that implements the steps of the preferred method.

The invention may also be implemented as hardware modules. More particularly, in the hardware sense, a module is a functional hardware unit designed for use with other components or modules. For example, a module may be implemented using discrete electronic components, or it can form a portion of an entire electronic circuit such as an Application Specific Integrated Circuit (ASIC). Numerous other possibilities exist. Those skilled in the art will appreciate that the system can also be implemented as a combination of hardware and software modules.

Figure 7:
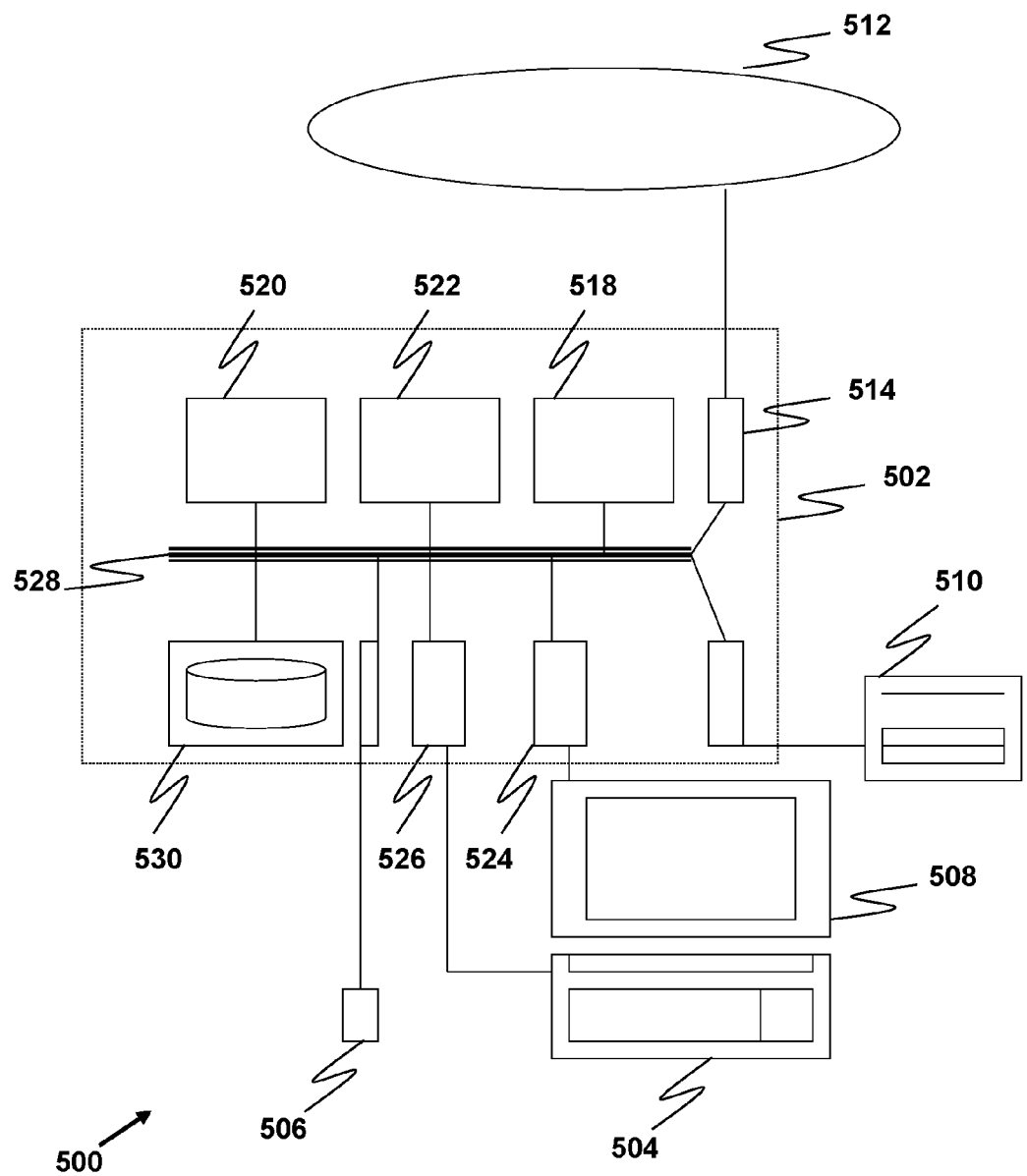
FIG. 7 illustrates a schematic diagram of one possible computer system that may be used to implement the system and method of the present invention.

The method and system of the example embodiment can be implemented on a computer system 500, schematically shown in FIG. 7. It may be implemented as software, such as a computer program being executed within the computer system 500, and instructing the computer system 500 to conduct the method of the example embodiment.

The computer system 500 can include a computer module 502, input modules such as a keyboard 504 and mouse 506 and a plurality of output devices such as a display 508, and printer 510. It is understood that both the computer system 500 and the various input and output devices may be located remotely from the Wind turbine generator 100. Alternately, portions of the computer system 500 may be located with the Wind turbine generator 100, while other portions are located remotely. It is also understood that multiple computer systems may be used to implement various parts of the method 400 as described above.

The computer module 502 can be connected to a computer network 512 via a suitable transceiver device 514, to enable access to e.g. the Internet or other network systems such as Local Area Network (LAN) or Wide Area Network (WAN).

The computer module 502 in the example includes a processor 518, a Random Access Memory (RAM) 520 and a Read Only Memory (ROM) 522. The computer module 502 also includes a number of Input/Output (I/O) interfaces, for example I/O interface 524 to the display 508, and I/O interface 526 to the keyboard 504. The components of the computer module 502 typically communicate via an interconnected bus 528 and in a manner known to the person skilled in the relevant art.

The application program can be supplied to the user of the computer system 500 encoded on a data storage medium such as a CD-ROM or flash memory carrier and read utilizing a corresponding data storage medium drive of a data storage device 530. The application program is read and controlled in its execution by the processor 518. Intermediate storage of program data maybe accomplished using RAM 720.

Embodiments of the present invention provide several advantages. Since the system and method may be implemented using currently available voltage and current measurements, no additional hardware need be installed on the WTG. The system and method provide a low cost option for determining a fault condition in one or more power filters connected to the WTG. The current system and method may thus be used to alert an operator of a power filter failure before any damage may occur to the components of the WTG.

Embodiments of the present invention provide a system and method to accurately detect all power filter failures. The method provides checks to indicate if the detecting result is not accurate. The method can detect power filter failures not only under nominal voltage but also under allowed operating grid voltages.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method for determining a fault in a power filter of a wind turbine generator, the method comprising:
    calculating, using a computer processor, a reactive power consumed by the power filter of the wind turbine generator during a transition from a pre-charge state to a run state of the wind turbine generator; and
    comparing the calculated reactive power to a predefined threshold reactive power to determine said fault.

2. The method of claim 1, wherein said calculated reactive power is based on a measured value of a converter leg current and one of a converter leg voltage for each phase wire of the wind turbine generator.

3. The method of claim 2, wherein the step of calculating the reactive power consumed by the power filter further comprises:
    calculating an adjusted average reactive power consumed at said pre-charge state by an auxiliary power supply of the wind turbine generator;
    calculating an adjusted average reactive power consumed by both the auxiliary power supply and the power filter in said run state; and
    calculating the average reactive power consumed by the power filter alone based on the values of the average reactive power consumed by the auxiliary power supply and the average reactive power consumed by both the auxiliary power supply and the power filter.

4. The method of claim 3, wherein the step of calculating the adjusted average reactive power consumed by said auxiliary power supply at said pre-charge state further comprises:
    connecting a DC link capacitor to a converter leg of said wind turbine generator;
    pre-charging said DC link capacitor while said power filter is disconnected; and
    obtaining said measured values during said pre-charge state;
and wherein the step of calculating an adjusted average reactive power consumed by both the auxiliary power supply and the power filter in said run state further comprises:
    electrically connecting said power filter;
    providing a time delay;
    calculating said adjusted average reactive power consumed by both the auxiliary power supply and the power filter over said period of time; and
    disconnecting said DC link capacitor.

5. The method of claim 1, wherein the step of calculating the reactive power consumed by the power filter comprises:
    calculating an average reactive power consumed by a grid converter leg of the wind turbine generator over a period of time.

6. The method of claim 5, wherein the step of calculating the average reactive power consumed by the grid converter leg further comprises:
    adjusting the average reactive power consumed by the grid converter leg by a voltage factor to determine an adjusted average reactive power consumed by the grid converter leg.

7. The method of claim 5, wherein one fundamental cycle is 0.02 seconds and the period of time is one or more fundamental cycles.

8. The method of claim 1, wherein said power filter is one of a grid-side power filter, a machine side dv/dt filter, or a stator filter, and said fault is at least one of a failure in a fuse, a failure in a capacitor, or a failure in a connection of said power filter.

9. A system for detecting a fault in a power filter of a wind turbine generator, the system comprising:
    a computer processor; and
    a plurality of sensors electrically connected to said wind turbine generator and said computer processor; wherein said computer processor is configured to:
    calculate, during a transition from a pre-charge state to a run state of the wind turbine generator, a reactive power consumed by the power filter based on data from said sensors; and
    compare the calculated reactive power to a predefined threshold reactive power to determine said fault.

10. The system of claim 9, wherein said sensors provide a measured value of a converter leg current and one of a converter leg voltage for each phase wire of the wind turbine generator.

11. The system of claim 10, wherein the processor calculates the reactive power consumed by the power filter by:
    calculating an adjusted average reactive power consumed at said pre-charge state by an auxiliary power supply of the wind turbine generator;
    calculating an adjusted average reactive power consumed by both the auxiliary power supply and the power filter in said run state; and
    calculating the average reactive power consumed by the grid filter alone based on the values of the average reactive power consumed by the auxiliary power supply and the average reactive power consumed by both the auxiliary power supply and the power filter.

12. The system of claim 11, wherein said processor calculates said adjusted average reactive power consumed by said auxiliary power supply at said pre-charge state by:
    connecting a DC link capacitor to a converter leg of said wind turbine generator;
    pre-charging said DC link capacitor while said power filter is disconnected; and
    obtaining said measured values during said pre-charge state;
and wherein said processor calculates said adjusted average reactive power consumed by both the auxiliary power supply and the power filter in said run state by:

electrically connecting said power filter;
providing a time delay;
calculating said adjusted average reactive power consumed by both the auxiliary power supply and the power filter over said period of time; and
disconnecting said DC link capacitor.

13. The system of claim 9, wherein said processor calculates an average reactive power consumed by a grid converter leg of the wind turbine generator over a period of time.

14. The system of claim 13, wherein said processor further calculates an average reactive power consumed by a grid converter leg by adjusting the average reactive power consumed by the grid converter leg by a voltage factor to determine an adjusted average reactive power consumed by the grid converter leg.

15. The system of claim 13, wherein one fundamental cycle is 0.02 seconds and the period of time is one or more fundamental cycles.

16. A non-transitory computer readable medium containing computer instructions stored therein for causing a computer processor to determine program code for determining a fault in a power filter of a wind turbine generator, the computer instructions being configured to:
calculate a reactive power consumed by the power filter of the wind turbine generator during a transition from a pre-charge state to a run state of the wind turbine generator; and
compare the calculated reactive power to a predefined threshold reactive power to determine said fault.

* * * * *